United States Patent [19]
Pai

[11] Patent Number: 5,977,784
[45] Date of Patent: *Nov. 2, 1999

[54] METHOD OF PERFORMING AN OPERATION ON AN INTEGRATED CIRCUIT

[75] Inventor: Deepak K. Pai, Burnsville, Minn.

[73] Assignee: General Dynamics Information Systems, Inc., Falls Church, Va.

[*] Notice: This patent is subject to a terminal disclaimer.

[21] Appl. No.: 09/136,907

[22] Filed: Aug. 20, 1998

Related U.S. Application Data

[62] Division of application No. 08/890,277, Jul. 9, 1997, Pat. No. 5,831,444, which is a continuation of application No. 08/591,739, Jan. 25, 1996, abandoned.

[51] Int. Cl.$^6$ .................................................. G01R 31/02
[52] U.S. Cl. .......................................... 324/758; 324/765
[58] Field of Search .................................... 324/765, 758, 324/754, 761, 762, 73.1, 158.1; 438/14, 17; 439/482; 257/40, 48

[56] References Cited

U.S. PATENT DOCUMENTS

| | | | |
|---|---|---|---|
| 3,568,831 | 3/1971 | Penberg | 209/73 |
| 4,954,878 | 9/1990 | Fox et al. | 357/81 |
| 4,975,637 | 12/1990 | Frankeny et al. | 324/158 F |
| 5,031,308 | 7/1991 | Yamashita et al. | 29/830 |
| 5,049,813 | 9/1991 | Van Loan et al. | 324/755 |
| 5,055,780 | 10/1991 | Takagi et al. | 324/158 F |
| 5,072,289 | 12/1991 | Sugimoto et al. | 357/68 |
| 5,302,891 | 4/1994 | Wood et al. | 324/765 |
| 5,337,466 | 8/1994 | Ishida | 29/830 |
| 5,342,207 | 8/1994 | Sobhani | 439/74 |
| 5,400,220 | 3/1995 | Swamy | 361/760 |
| 5,414,372 | 5/1995 | Levy | 324/754 |
| 5,415,555 | 5/1995 | Sobhani | 439/74 |
| 5,420,521 | 5/1995 | Jones | 324/760 |
| 5,532,612 | 7/1996 | Liang | 324/765 |

*Primary Examiner*—Vinh P. Nguyen
*Attorney, Agent, or Firm*—Kinney & Lange

[57] ABSTRACT

A method and apparatus for performing a function on an integrated circuit having a plurality of electrical contact pads is disclosed. The apparatus includes a substrate for performing the function on the integrated circuit, the substrate having a plurality of electrical contact pads and at least one electrical test contact pad. A centering housing encompasses the integrated circuit and centers the integrated circuit with respect to the substrate such that the plurality of electrical contact pads of the integrated circuit electrically connects with the plurality of electrical contact pads of the substrate. A test connector connects integrated circuit to the substrate. The test connector includes a body, at least one electrical pin positioned on the body for interconnection with external circuitry, at least one electrical test contact pad positioned on the cover for electrical contact with the electrical test contact pad of the substrate, and a flexible membrane positioned on the body for providing a force to the integrated circuit, thereby forcing the integrated circuit in electrical connection with the test substrate.

8 Claims, 5 Drawing Sheets

METHOD OF PERFORMING AN OPERATION ON AN INTEGRATED CIRCUIT

CROSS-REFERENCE TO RELATED APPLICATION(S)

This application is a division of application Ser. No. 08/890,277 filed Jul. 9, 1997, now U.S. Pat. No. 5,831,444 granted Nov. 3, 1998, which in turn is a continuation of application Ser. No. 08/591,739 filed Jan. 25, 1996, now abandoned.

BACKGROUND OF THE INVENTION

The present invention relates to circuit board construction. More specifically, the present invention relates to an apparatus and method for performing a function, such as burning-in, testing or programming on an integrated circuit.

For years, it has been customary to employ printed circuit boards or printed circuit assemblies as media for mechanically holding electronic components and providing operative electrical connections between the components. Typically, printed circuit boards or printed circuit assemblies comprise an insulating substrate or layer upon which a layer of conductive metal was deposited or bonded. The metal coating layer was etched by a chemical process to form a predetermined pattern of conductive traces on the surfaces of the substrate. Alternatively, the conductive traces were deposited onto the insulator using selective deposit techniques, such as masks. These electrical conductive traces could be formed on both sides of the substrate to allow conductors to cross without coming in contact with one another. A plurality of vias or plated through holes were formed through the metal layers and the insulating substrate and were positioned to receive leads from the electronic components.

As circuit board technology developed, designers began to create circuit boards comprising many alternating insulating substrate and conductive layer pairs, resulting in sandwiched circuit boards that could accommodate a higher component density. In addition, surface mount technology allowed the leads to be soldered to solder pads on the surface of the circuit board, rather than requiring the leads to pass through and be soldered to through holes.

Electronic components themselves also underwent changes to accommodate higher density. First, integrated circuits were originally placed in dual in-line packages, each consisting of an elongated plastic or ceramic body encapsulating the integrated circuit and a plurality of electrical leads coupled to the integrated circuit and arranged in a series extending from the two long edges of the body. The leads could either be through hole soldered or surface mounted. However, the number of leads that a dual in-line package could accommodate was a function of the length of the dual in-line package body edges. Later, packages were provided having leads extending from all four edges of the body. However, the number of leads was still a function of the perimeter of the body edges.

In a further effort to increase lead density, designers developed quad-flat packs comprising generally square bodies having leads extending downward from the lower surface of the body. The leads were typically arranged in multi rows and columns, allowing the quad-flat packs to accommodate more pins than dual in-line packages. However, limitations in socket size and collective lead insertion force began to be problematic.

Presently, designers are focusing on ball grid array packaging wherein leads are replaced with a finely pitched matrix of conductive contact surfaces on the lower surface of an otherwise conventional body. The circuit board to which a ball grid array package is to be mounted is conventionally provided with a matrix of corresponding surface mounted flat pad structures upon each of which is deposited a small quantity of solder. To mount the ball grid array package to the circuit board, the ball grid array package is temporarily clamped to the board and the board is heated, causing the solder to melt fusing the corresponding surfaces together and yielding a strong mechanical and electrical connection when cooled.

Ball grid array packaging provides a powerful tool in the further miniaturization of computers. However, systems designed to burn-in, test or program the components are lagging in technology. Thus, there is a continuing need for a system which is capable of testing, burning-in, or programming an integrated circuit.

SUMMARY OF THE INVENTION

The present invention is an apparatus and method for performing a function, such as testing, burning-in or programming on an integrated circuit having a plurality of electrical contact pads, such as a ball grid array package. The apparatus includes a substrate for performing the desired function on the integrated circuit. The substrate includes a plurality of electrical contact pads and at least one electrical test contact pad. A centering housing centers the integrated circuit with respect to the substrate such that the plurality of electrical contact pads of the integrated circuit electrically connects with the plurality of electrical contact pads of the substrate. A test connector ensures that integrated circuit is properly connected to the substrate. The test connector further includes a body, at least one electrical contact pin for interconnection with external circuitry, at least one electrical test contact pad for electrical connection with the plurality of electrical test contact pads of the substrate, and a flexible membrane for providing a force on the integrated circuit, thereby forcing the integrated circuit in electrical connection with the test substrate.

In one preferred embodiment, the substrate comprises a substantially non-malleable board having a ball grid array pattern. The board has a thickness in the range of approximately 0.050 inches to 0.250 inches.

In another preferred embodiment, the substrate comprises an insulating film having a first conductive film layer positioned on a first surface of the insulating film and a second conductive film layer positioned on a second surface of the insulating film of the insulating film. In addition, the substrate further includes at least one plated through hole protruding through the first conductive film layer and the insulating film to the second conductive film layer. A bump-like metal protrusion is formed adjacent to each through hole on the first conductive film layer, thereby forming the electrical contact pads.

In another preferred embodiment, the flexible membrane includes a chamber having a valve for varying a pressure within the flexible membrane, thereby varying the force to the integrated circuit.

In still another embodiment, the apparatus includes an elastomer film positioned on a bottom surface of the cover to provide the force on the integrated circuit.

DETAILED DESCRIPTION OF THE PREFERRED EMBODIMENTS

Figure 1:
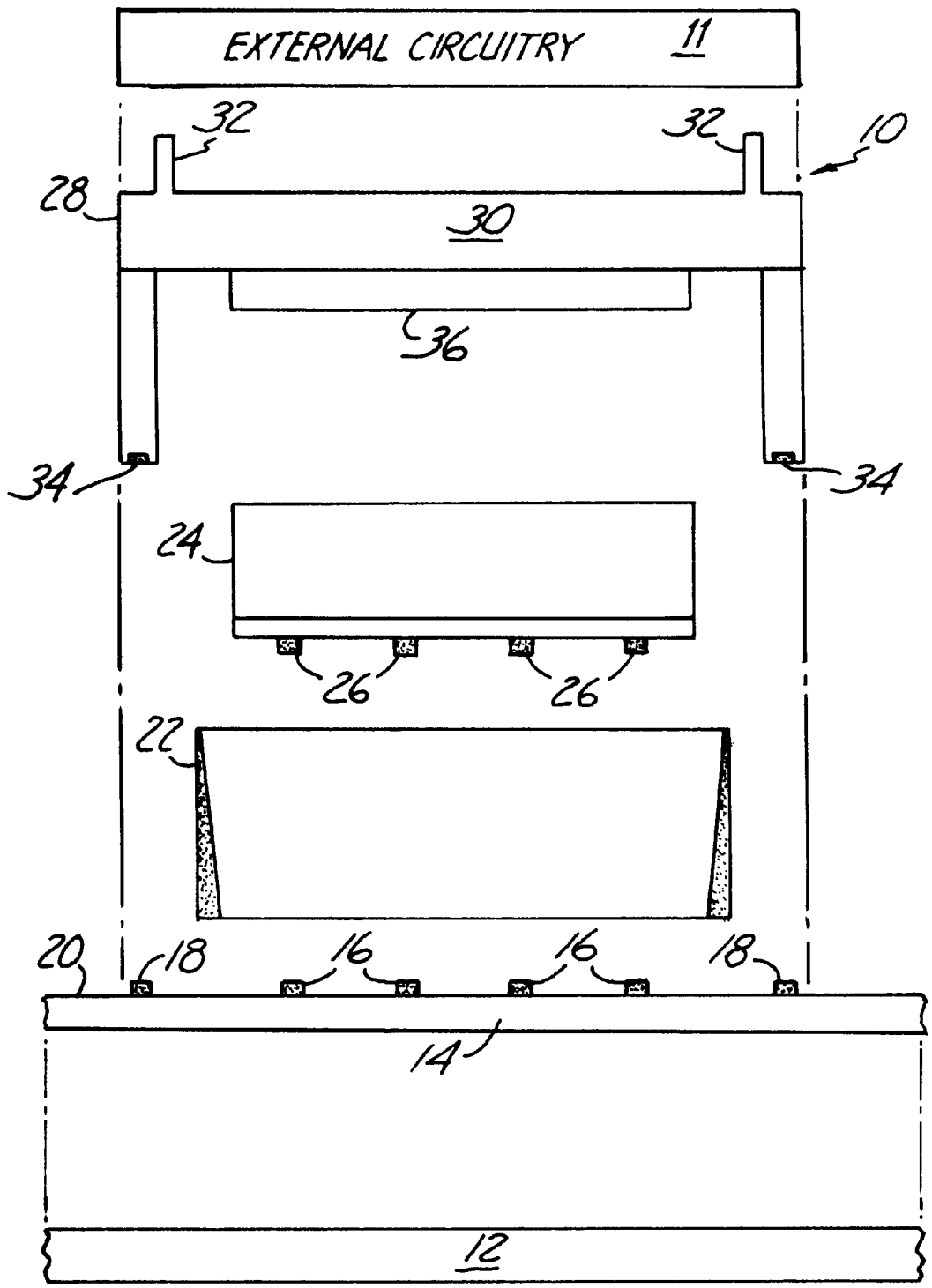
FIG. 1 is a side view of an integrated circuit device testing apparatus constructed in accordance with the method of the present invention.

The present invention is an apparatus for and a method of performing a function on an integrated circuit. FIG. 1 shows a side view of testing device 10. Testing device 10 includes external circuitry 11, mother board 12, substrate 14 having electrical contact pads 16 and electrical test contact pads 18 on top surface 20, centering housing 22, integrated circuit 24 having electrical contact pads 26, and test housing 28 having body 30, electrical pins 32, electrical test contact pads 34 and flexible membrane 36.

In operation, testing device 10 is used to implement a variety of functions on integrated circuit 24. First, testing device 10, through use of external circuitry 11, tests integrated circuit 24 by providing a current through integrated circuit 24 and evaluating whether integrated circuit 24 electrically works or electrically does not work as desired, thereby determining whether integrated circuit 24 complies with test requirements.

Second, test device 10, through use of external circuitry 11, "burns-in" integrated circuit 24. In order to extract "infant death" failures, test device 10 subjects integrated circuit 24 to repeated testing cycles in an environmentally controlled chamber in order to detect a circuit which may fail during initial utilization (i.e. infant death). An example of burning-in integrated circuit 24 is to subject the integrated circuit 24 to a predetermined temperature, i.e. in the range of 100° C. to 350° C., for a predetermined period of time, i.e. one week.

Third, testing device 10, through use of external circuitry 11, programs integrated circuit 24, if integrated circuit 24 is a memory device. Testing device 10 programs integrated circuit 24 such that integrated circuit 24 retains the desired predetermined information.

In operation, for testing device 10, through use of external circuitry 11, to perform one or more of the above mentioned functions, i.e., testing, burning-in or programming, integrated circuit 24 is loaded into centering housing 22. As shown in FIG. 1, the walls of centering housing 22 are sloped such that integrated circuit 24 will automatically be centered within centering housing 22. The sloped walls of centering housing 22 form opening 23 sized to permit at least a lower portion of integrated circuit 24 to come in contact with substrate 14. Centering housing 22 and integrated circuit 24 are then positioned on substrate 14 such that electrical contact pads 26 of integrated circuit 24 come in electrical contact with electrical contact pads 16 of substrate 14. The present thinking is for contact pads 26 to be in the form of a ball grid array. Test housing 28 is then lowered on top of centering housing 22 and substrate 14 until electrical test contact pads 34 of test housing 28 comes in electrical contact with electrical test contact pads 18 of substrate 14. Flexible membrane 36 assures that force is evenly applied to the top of integrated circuit 24 so it is parallel to substrate 14 on centering housing 22 and all of pads 26 mate with respective pads 16. The electrical connection of electrical test contact pads 34 and 18 ensure that electrical contact pads 26 of integrated circuit 24 are in electrical connection with electrical contact pads 16 of substrate 14. Finally, electrical pins 32 of test housing 28 are connected to external circuitry 11 in order to perform the desired function, i.e. testing, burning-in or programming on integrated circuit 24. Electrical current is supplied to integrated circuit 24 via pins 32, pads 34, pads 18, pads 16 and pads 26.

As shown in FIG. 1, centering housing 22 is a separate component of test device 10. However, it is understood that centering housing 22 may be permanently affixed to top surface 20 of substrate 14. Thus, once integrated circuit 24 is positioned within centering housing 22, it would both be centered within centering housing 22 and positioned adjacent to substrate 14.

Substrate 14 can be any number of materials or combination of materials. In one preferred embodiment, substrate 14 is formed of glass, and more specifically, Pyrex glass or another non-malleable insulator. Electrical contact pads 16 and electrical test contact pads 18 can also be formed from a variety of electrically conducting materials. In one preferred embodiment, electrical contact pads 16 and electrical test contact pads 18 are formed from a combination of nickel and gold.

In prior art testing devices, contact pads similar to electrical contact pads 16 and electrical test contact pads 18 were formed using a base of copper with a nickel and gold overlay. However, in the present embodiment, since substrate 14 is formed from glass, a material being substantially non-malleable, it is desirable to have electrical contact pads 16 and electrical test contact pads 18 formed from a more malleable material than copper. Thus. nickel and gold are used.

In one preferred embodiment, substrate 14 has a thickness in the range of approximately 0.050 inches to 0.250 inches, and preferably has a thickness of 0.125 inches. In addition, substrate 14 can vary in its length and width, depending on the number of integrated circuits similar to integrated circuit 24 being tested, burned-in or programmed at one time on the substrate. Thus, substrate 14 can vary in size from two inches by two inches to twelve inches by twelve inches.

As previously mentioned, in one preferred embodiment, substrate 14 is formed from pyrex glass or another substantially non-malleable insulator material. Thus, it is critical that test housing 28 supplies a significant pressure onto integrated circuit 24 such that all electrical contact pads 26 of integrated circuit 24 come in contact with all electrical contact pads 16 of substrate 14, without crushing or damaging any of electrical contact-pads 26 of integrated circuit 24. Electrical contact pads 26 of integrated circuit 24 can be formed from a variety of materials depending on the type of integrated circuit and the function to be performed by the integrated circuit. In one preferred embodiment, electrical contact pads 26 of integrated circuit 24 are formed from a copper base having gold and/or nickel plating.

In order to provide the proper amount of pressure to ensure that all electrical contact pads 26 of integrated circuit 24 are in electrical connection with all electrical contact pads 16 of substrate 14, but that electrical contact pads 26 are not being deformed or damaged, flexible membrane 36 is positioned on body 30 of test housing 28. As shown in FIG. 1, while test housing 28 is being positioned on top of centering housing 22 and integrated circuit 24, flexible membrane 36 will push down on integrated circuit 24 to ensure that integrated circuit 24 does not become canted or sloped within centering housing 22 and to ensure proper electrical connection between electrical contact pads 26 of integrated circuit 24 and electrical contact pads 16 of substrate 14. In one preferred embodiment, flexible membrane 36 is formed from an elastomer material. The elastomer film provides the pressure needed to ensure an electrical connection without damaging electrical contact pads 16 and 26.

Figure 2:
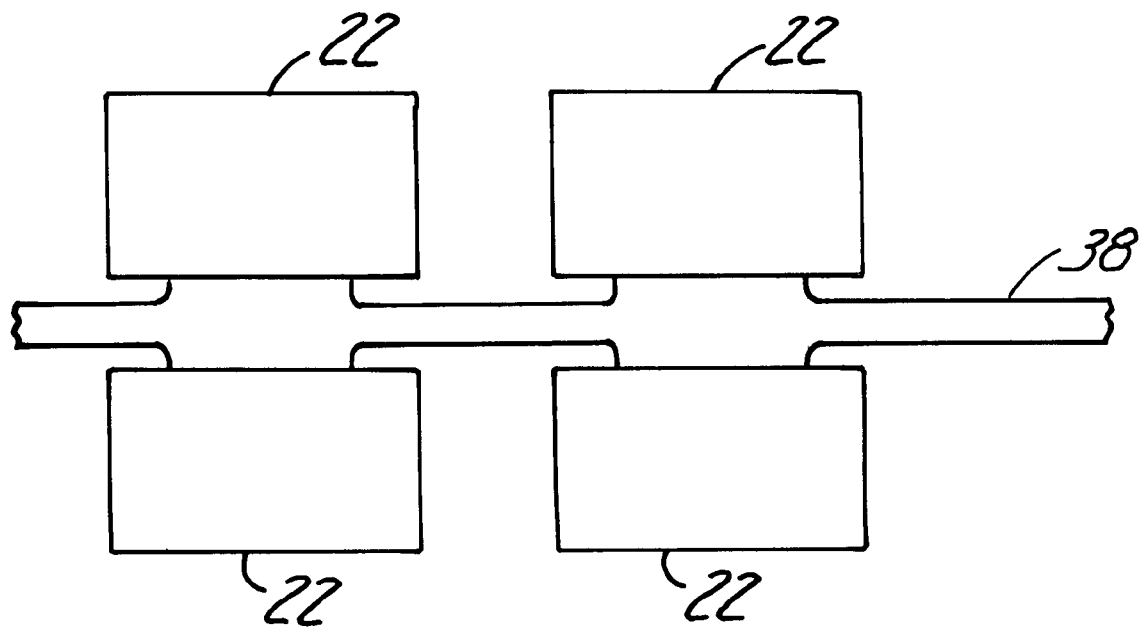
FIG. 2 is a top view depicting a plurality of housings interconnected, each housing being identical to a centering housing shown in FIG. 1.

FIG. 2 is a top view depicting a plurality of housings 14 interconnected by tie 38 positioned on substrate 14. Tie 38 can be formed of any of a variety of materials. In one preferred embodiment, tie 38 is formed of plastic.

As shown in FIG. 2, four centering housings 22 are shown interconnected by tie 38. However, it is understood that any number of centering housings could be interconnected by tie 38. Thus, numerous integrated circuits could be centered within centering housings 22 and connected to substrate 14 and tested, burned-in or programmed at one time.

Figure 3:
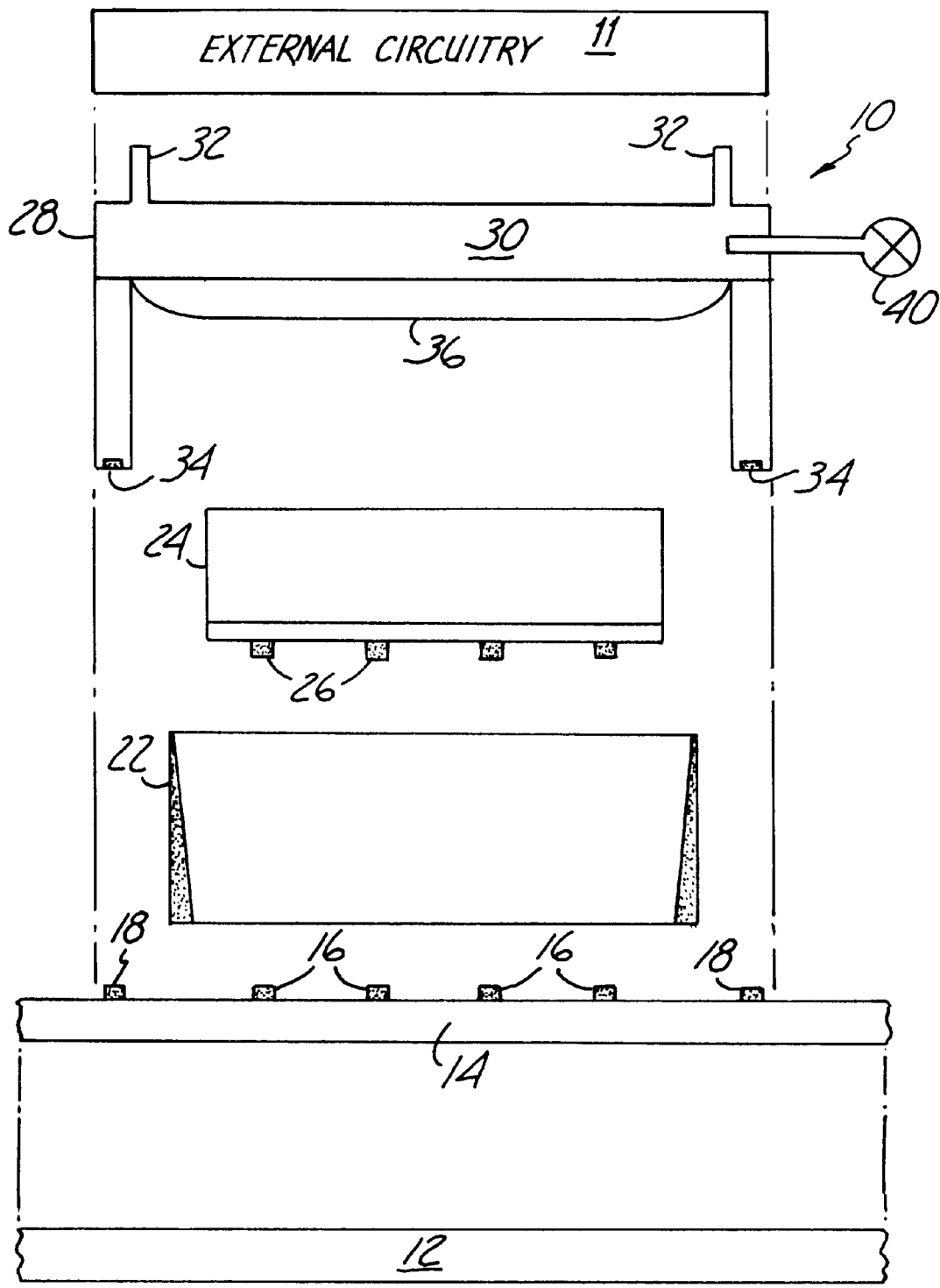
FIG. 3 is a side view of a second embodiment of an integrated circuit device testing apparatus constructed in accordance with the method of the present invention.

FIG. 3 is a side view of a second embodiment of testing device 10. Several elements of testing device 10 are identical to and have been labeled the same as those of testing device 10 shown in FIG. 1. As shown in FIG. 3, flexible membrane 36 is an inflatable membrane and further includes pressure valve 40 connected to a fluid source, not shown. In operation, integrated circuit 14 centered within centering housing 22 is positioned on top of substrate 14. Test housing 28 is then positioned on top of both centering housing 22 and substrate 14. Air or other fluid is then forced into flexible membrane 36 via valve 40 to vary the pressure within flexible membrane 36, thus varying the force to integrated circuit 24. Flexible membrane 36 can be formed from a variety of materials. In one preferred embodiment, flexible membrane 36 is formed from a polyimide film. The pressure within flexible membrane 36 can be varied until all electrical contact pads 26 of integrated circuit 24 are in all electrical connection with electrical contact pads 16 of substrate 14. In one preferred embodiment, the pressure within flexible membrane 36 is in the range of approximately 20 to 100 pounds per square inch, and preferably 60 pounds per square inch.

Figure 4:
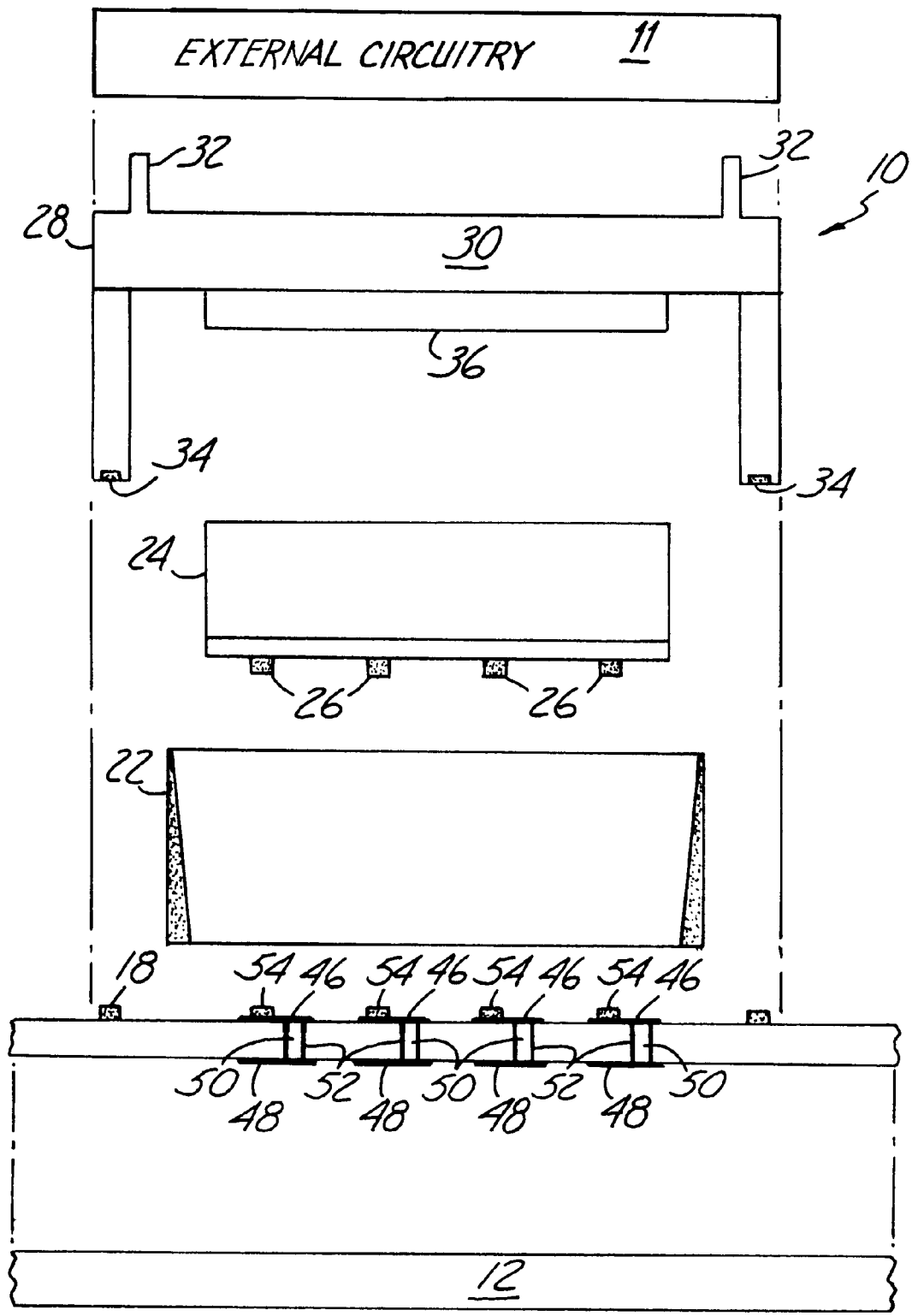
FIG. 4 is a side view of a third embodiment of an integrated circuit device testing apparatus constructed in accordance with the method of the present invention.
Figure 5:
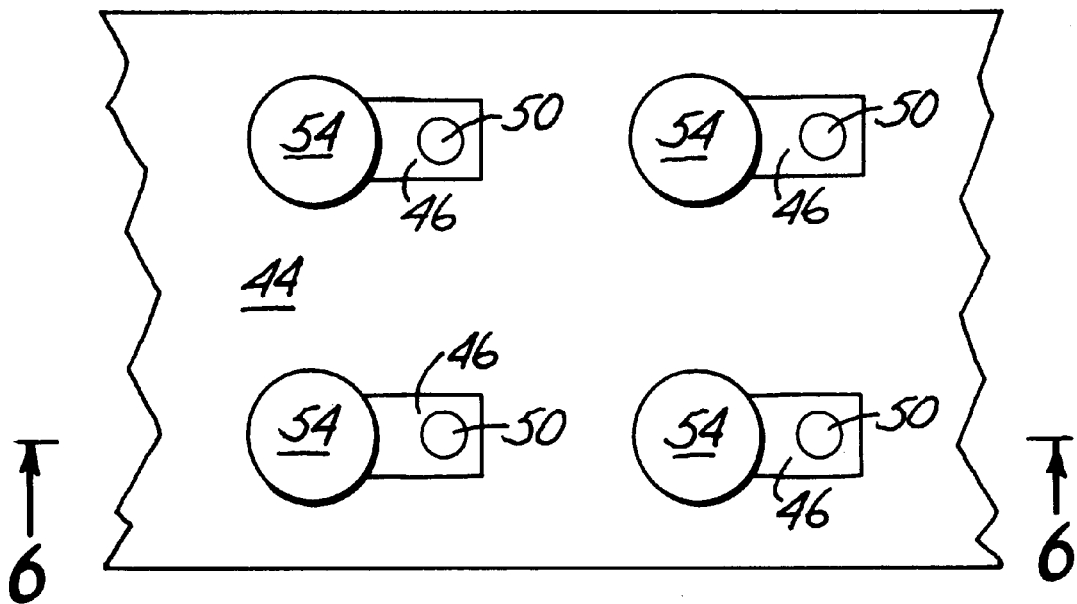
FIG. 5 is a top plan view showing a portion of the test substrate used in the present invention.
Figure 6:
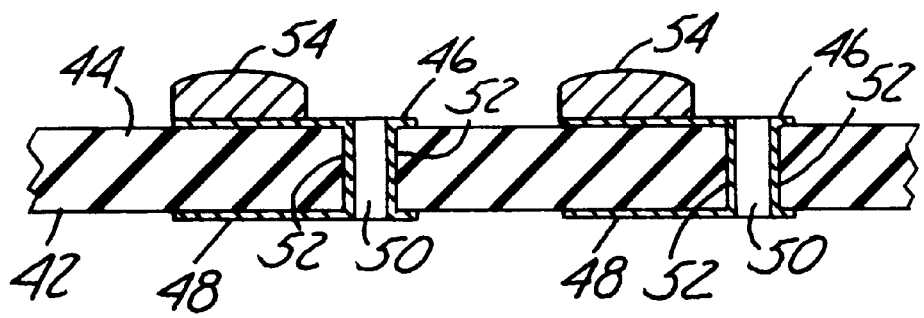
FIG. 6 is a cross-sectional view of the test substrate as shown from line 6—6 of FIG. 5.

FIG. 4 is a side view of a third embodiment of the present invention. FIG. 5 is a top plan view of a portion of substrate 42 of FIG. 4. FIG. 6 is a cross-sectional view of substrate 42 as shown from line 6—6 of FIG. 5. As with FIG. 3, testing device 10 of FIGS. 4, 5 and 6 is similar to testing device 10 of FIG. 1. Thus, similar elements have been labeled with identical numbers.

As shown in FIG. 4, substrate 14 of FIG. 1 has been replaced with substrate 42. In one preferred embodiment, substrate 42 comprises insulating fim 44, conducting film layers 46 and 48, through holes 50 that are electrically plated at 52.

Substrate 42 is a more malleable substrate than substrate 12 of FIGS. 1–3. In one preferred embodiment, substrate 42 is an insulating film. More specifically, substrate 42 is a polyimide film having a thickness in the range of approximately 0.0005 inches to 0.003 inches. In another preferred embodiment, conducting layers 46 and 48 are formed of copper and have a thickness in the range of approximately 0.0002 inches to 0.0005 inches.

As with electrical contact pads 16 and 26 shown in FIGS. 1–3, bumps 54 can be formed in a variety of configurations or circuit patterns, such as a ball grid array package formation.

As shown in FIG. 4, bumps 54 are positioned adjacent to, but do not overlap, through holes 50. This type of off center arrangement is important when using a malleable substrate, such as a polyimide film, for substrate 42. Depending on the type of test housing 28 used, a test housing may provide unequal forces onto integrated circuit 24. Thus, some of electrical contact pads 26 of integrated circuit 24 may not be in electrical contact with their corresponding electrical contact pads 54 of substrate 42. Likewise, if the top surface of substrate 42 and the bottom surface of integrated circuit 24 are not co-planar, each electrical contact pad 26 of integrated circuit 24 will not make electrical connection with each corresponding bump 54 of substrate 42. If all corresponding electrical contact pads 26 and bumps 54 are not in proper electrical connection, the function to be formed on integrated circuit 24, i.e. testing, burning-in or programming, will not be properly completed. Previous designs which have bumps 54 positioned directly above through holes 50 have suffered from improper electrical connections due to the flexibility of substrate 42 and the rigidity provided by the plated holes. The present design shown in FIG. 4 overcomes this problem by providing a cantilever effect between bump 54, conducting layers 46 and 48, and through holes 50, thereby assuring proper alignment of the integrated circuit against substrate 42 and proper alignment of contacts 26 with contacts 54.

Conducting layer 48 can be connected to mother board 12 via electrical leads, such as gold wires. The electrical connection between integrated circuit 24 and mother board 12 is completed by electrical contact pads 26, bumps 54, conductive layer 46, electrical plating 52 and conducting layer 48.

The present system provides a novel system and method for performing a function on an integrated circuit. The system and method ensures that all necessary electrical connections are properly completed to ensure that the desired function is completed. Although the present invention has been described with reference to preferred embodiments, workers skilled in the art will recognize that changes may be made in form and detail without departing from the spirit and scope of the invention.

What is claimed is:

1. A method of performing an operation on an integrated circuit having a plurality of electrical contact pads, the method comprising:

centering the integrated circuit in a centering housing having a plurality of sloped walls to position the integrated circuit adjacent to a substrate such that a plurality of electrical contact pads of the substrate are positioned adjacent the plurality of electrical contact pads of the integrated circuit, the substrate having at least one electrical test connector pad;

placing a test connector onto the centering housing and the substrate such that at least one electrical test contact positioned on the test connector is in electrical connection with at least one electrical test connector pad of the substrate, wherein a flexible membrane of the test connector forces the electrical contact pads of the integrated circuit in electrical connection with the electrical contact pads of the substrate;

electrically connecting external circuitry to the test connector; and performing the operation on the integrated circuit via the test connector and the substrate.

2. The method of claim 1 wherein the step of centering the integrated circuit further comprises:

centering the integrated circuit in the centering housing onto a substantially non-malleable board having a bump and circuit pattern.

3. The method of claim 1 wherein the step of centering the integrated circuit further comprises:

centering the integrated circuit in the centering housing onto an insulating film having a first conductive film layer positioned on a first surface of the insulating film and a second conductive film layer positioned on a second surface of the insulating film.

4. The method of claim 1 and further comprising:

varying a pressure within the flexible membrane, thereby varying the force to the integrated circuit.

5. The method of claim 1 and further comprising:

forcing the plurality of electrical contact pads of the integrated circuit in electrical connection with the electrical contact pads of the substrate via an elastomer film positioned on the test connector.

6. The method of claim 1 wherein the step of performing the operation further comprises:

testing the integrated circuit to ensure that the integrated circuit complies with test requirements.

7. The method of claim 1 wherein the step of performing the operation further comprises:

programming the integrated circuit with predetermined information.

8. The method of claim 1 wherein the step of performing the operation further comprises:

burning-in the integrated circuit to ensure that the integrated circuit functions properly when subject to a predetermined temperature for a predetermined period of time.

* * * * *